(12) United States Patent
Iwashita

(10) Patent No.: US 8,160,859 B2
(45) Date of Patent: Apr. 17, 2012

(54) MEDIUM STORING LOGIC SIMULATION PROGRAM, LOGIC SIMULATION APPARATUS, AND LOGIC SIMULATION METHOD

(75) Inventor: Hiroaki Iwashita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 441 days.

(21) Appl. No.: 12/499,148

(22) Filed: Jul. 8, 2009

(65) Prior Publication Data

US 2010/0106477 A1 Apr. 29, 2010

(30) Foreign Application Priority Data

Oct. 29, 2008 (JP) .................................. 2008-277638

(51) Int. Cl.
*G06F 17/50* (2006.01)
*G06F 17/10* (2006.01)
(52) U.S. Cl. .................. 703/15; 703/2; 703/14; 326/93; 326/94; 716/115
(58) Field of Classification Search .......... 703/2, 13–15; 716/106, 108, 110, 115, 136; 326/31, 93, 326/94; 702/69
See application file for complete search history.

(56) References Cited

U.S. PATENT DOCUMENTS

| | | | |
|---|---|---|---|
| 7,333,926 B2* | 2/2008 | Schuppe ........................ | 703/15 |
| 7,356,789 B2* | 4/2008 | Ly et al. ........................ | 716/108 |
| 7,640,151 B2* | 12/2009 | Smith et al. ..................... | 703/14 |
| 7,712,062 B2* | 5/2010 | Ly et al. ........................ | 716/106 |
| 7,888,971 B2* | 2/2011 | Iwashita ........................ | 326/93 |
| 7,966,468 B1* | 6/2011 | Simeral et al. ................. | 711/167 |
| 2005/0216247 A1 | 9/2005 | Ikeda et al. ..................... | 703/19 |

FOREIGN PATENT DOCUMENTS

| | | |
|---|---|---|
| JP | 2001-229211 | 8/2001 |
| JP | 2003-233638 | 8/2003 |
| JP | 2005-284426 | 10/2005 |

OTHER PUBLICATIONS

Wu, W. Measurement of Jitter Frequency Variations in Communication Signals, 15th International Conference on Software, Telecommunications and Computer Networks, 2007, pp. 1-5.*
Litterick, M. et al., *Pragmatic Simulation-Based Verification of Clock Domain Crossing Signals and Jitter using System Verilog Assertions*, Proc. Design and Verification Conference and Exhibition, 2006, pp. 1-6.
Ly, T. et al., *Formally Verifying Clock Domain Crossing Jitter Using Assertion-Based Verification*, Proc. Design and Verification Conference and Exhibition, 2004, pp. 1-5.

* cited by examiner

*Primary Examiner* — Russell Frejd
(74) *Attorney, Agent, or Firm* — Staas & Halsey LLP

(57) ABSTRACT

A logic simulation apparatus includes: a jitter detector generation section 21 that generates information concerning a jitter circuit for determining whether a time variation occurs in signal passing between a first circuit and a second circuit, the first circuit configured to output a signal with a clock output from a predetermined clock source and the second circuit configured to output a signal with a clock output from a clock source different from the above predetermined clock source; and a constraint solver generation section 22 that generates information concerning a solver that is configured to create a signal to be output at an observation point using a logical expression of an output signal of the second circuit and output, based on the logical expression and output signal of the jitter detector circuit, a signal constrained by the output signal of the jitter detector circuit and output signal of the second circuit.

12 Claims, 18 Drawing Sheets

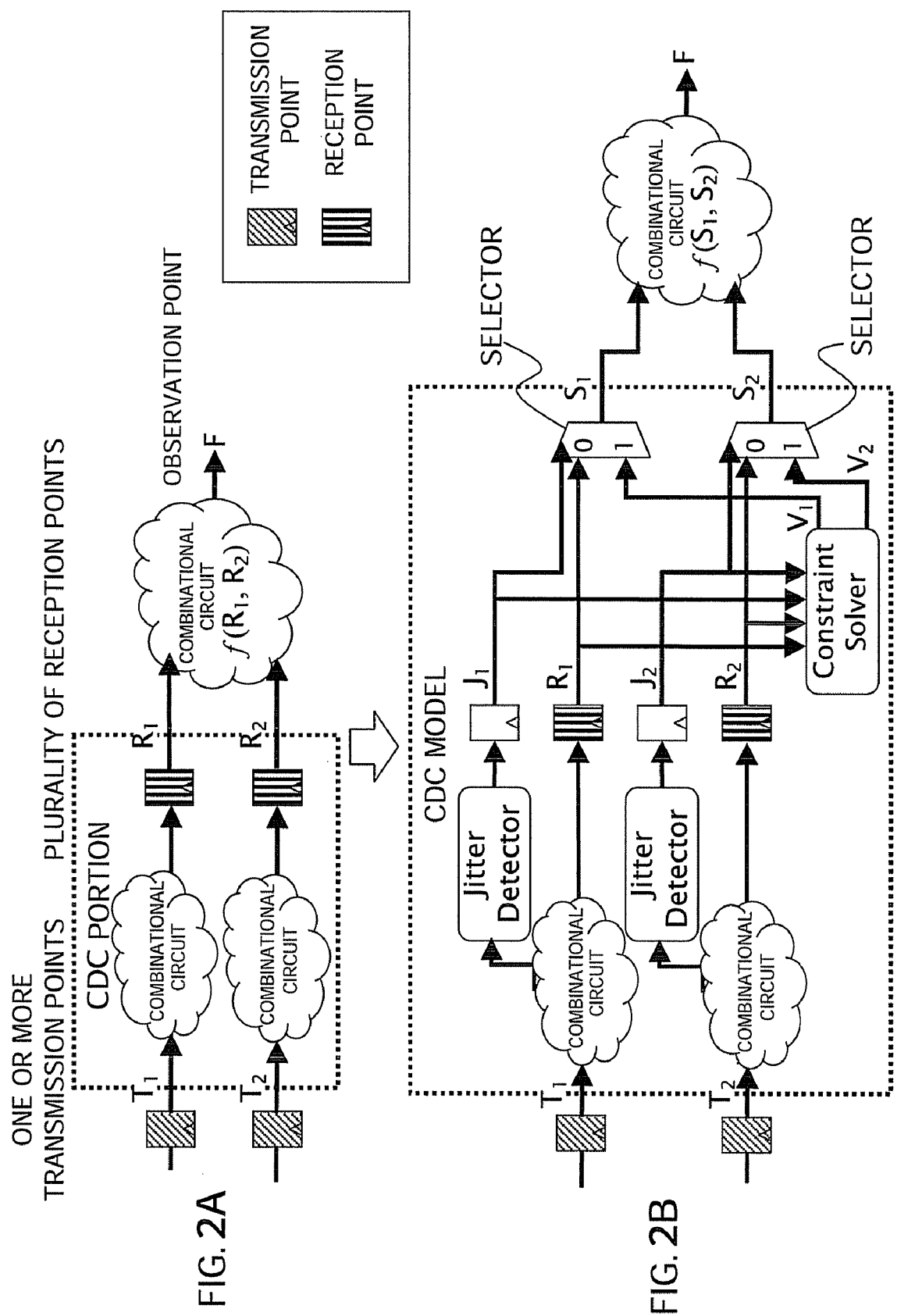

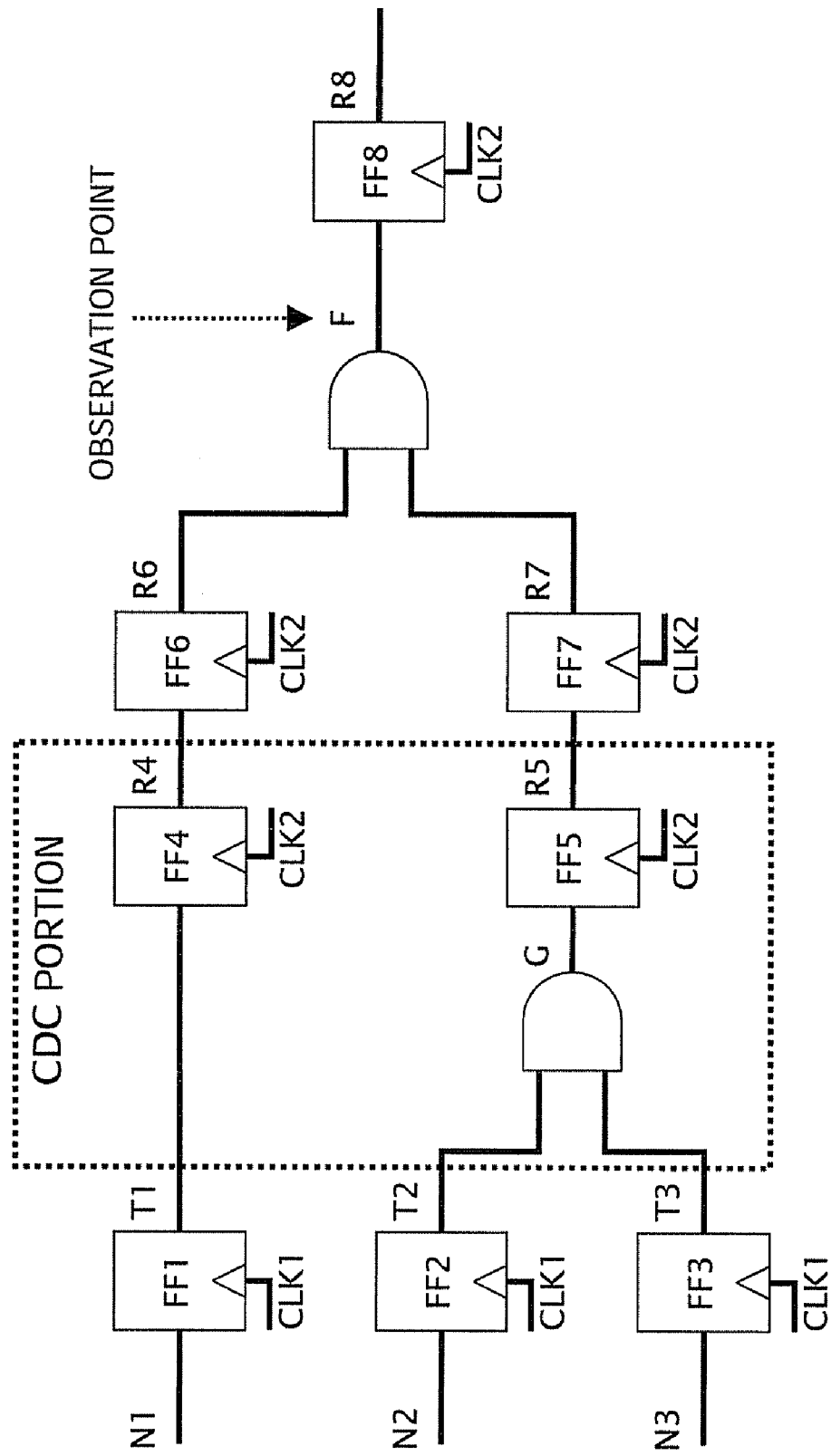

FIG. 4A

FF LIST

| NAME | CLOCK | INPUT | OUTPUT |
|------|-------|-------|--------|
| FF1  | CLK1  | N1    | T1     |
| FF2  | CLK1  | N2    | T2     |
| FF3  | CLK1  | N3    | T3     |
| FF4  | CLK2  | T1    | R4     |
| FF5  | CLK2  | G     | R5     |
| FF6  | CLK2  | R4    | R6     |
| FF7  | CLK2  | R5    | R7     |
| FF8  | CLK2  | F     | R8     |
| ⋮    |       |       |        |

FIG. 4B

COMBINATIONAL LOGIC LIST

| NAME | DEFINITION |
|------|------------|
| F    | R6 & R7    |
| G    | T2 & T3    |
| ⋮    |            |

CDC LIST

FIG. 5A

| NAME | TRANSMITTING FF LIST | RECEIVING FF |
|---|---|---|
| CDC1 | FF1 | FF4 |
| CDC2 | FF2,FF3 | FF5 |
| ⋮ | | |

FIG. 5B

OBSERVATION POINT LIST

| NAME |
|---|
| F |
| ⋮ |

FIG. 7A

```
module JitterDetector(
    input T,
    output reg E);
parameter PERIOD = 1;
 always @(T) begin
    E <= 1;
    #PERIOD;
    E <= 0;
  end
endmodule
```

FIG. 7B

```
module JitterDetector(
    input T,
    output reg E,
    input reg RX_CLK);
  always @(T) begin
    E <= 1;
    @(posedge RX_CLK);
    E <= 0;
  end
endmodule
```

FIG. 9

```
module ConstraintSolver(input R4, R5, J_R4, J_R5,
                        output V_R4, V_R5);
    class Solver;
        rand bit V_R4, V_R5;
        bit R4, R5, J_R4, J_R5;
        constraint c {
            ((J_R4?V_R4:R4) & (J_R5?V_R5:R5)) != (R4 & R5);
        }
    endclass
    Solver s = new;
    logic covered = 0;
    always @* begin
        s.R4 = R4;
        s.R5 = R5;
        s.J_R4 = J_R4;
        s.J_R5 = J_R5;
        if (s.randomize()) covered = 1;
        V_R4 = s.V_R4;
        V_R5 = s.V_R5;
    end
endmodule
```

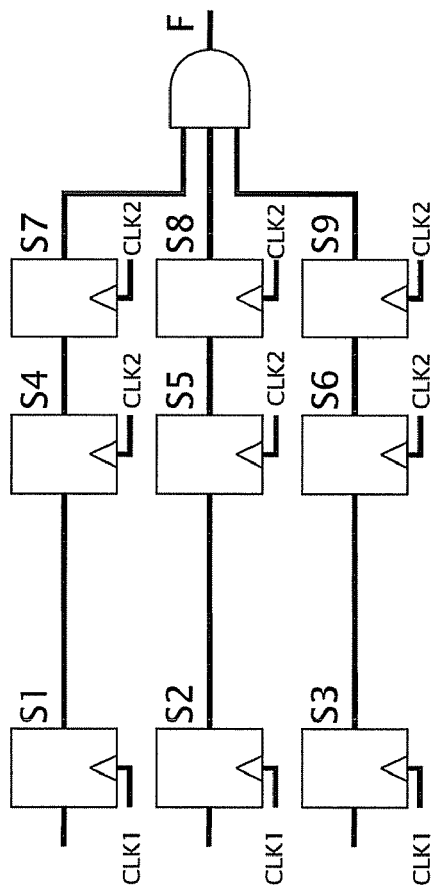
FIG. 19A
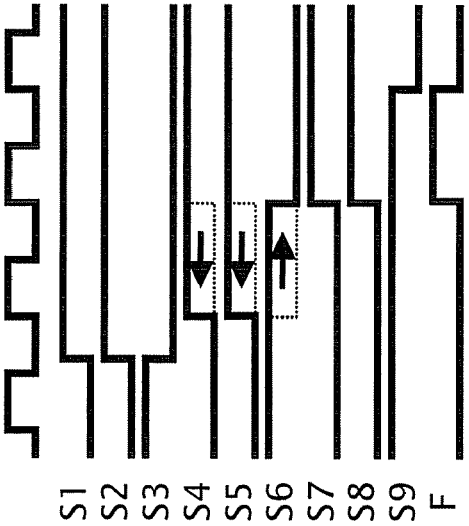
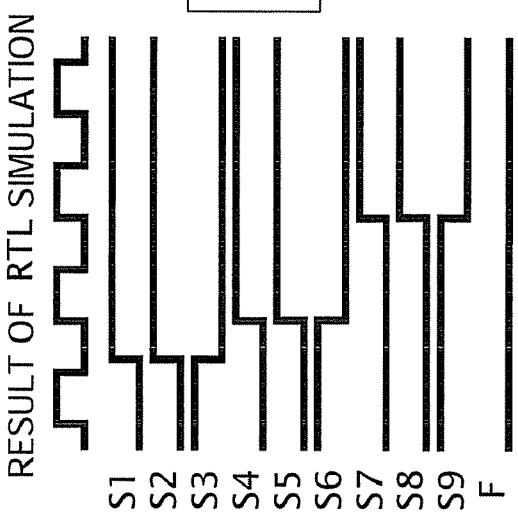
FIG. 19B

MEDIUM STORING LOGIC SIMULATION PROGRAM, LOGIC SIMULATION APPARATUS, AND LOGIC SIMULATION METHOD

CROSS-REFERENCE TO RELATED APPLICATION

This application is based upon and claims the benefit of priority of the prior Japanese Patent Application No. 2008-277638, filed on Oct. 29, 2008, the entire contents of which are incorporated herein by reference.

FIELD

The present invention relates to a medium storing a logic simulation program, a logic simulation apparatus, and a logic simulation method that confirm whether a hardware logic design satisfies its specification.

BACKGROUND

Recent hardware is generally constituted by a plurality of clock domains (clock domain: synchronous circuit domain operating with a specific clock signal or a clock signal obtained by dividing the frequency of the specific clock signal) and, thus, a verification of a mechanism of CDC (Clock Domain Crossing) between different clock domains becomes important. As an effective technique for verifying the CDC, simulation (CDC simulation) in which influence of the CDC is modeled in a logic level has now gotten attention.

FIG. 14A shows an arrangement example of clock domains, and FIG. 14B shows output timings of respective signals in the arrangement of FIG. 14A as a timing chart in which time is plotted on the horizontal axis. It is assumed that clock signals CLK1 and CLK2 have clock sources independent of each other. At the design stage of RTL (Register Transfer Level), it is impossible to estimate in which order and at which timing signal changes of A1 and B1 reach the clock domain 2. Further, the CLK1 and CLK2 are input to the clock domain 1 and clock domain 2 at different timings, so that it is unavoidable for the signal change to undergo Setup Time violation/Hold Time violation. In the configuration shown in FIGS. 14A and 14B, the output timing of the signal B2 becomes non-deterministic (random) which is called a meta-stable state.

Another arrangement example of clock domains will be described with reference to FIGS. 15A and 15B. In the example of FIG. 15A, a non-predictable operation is caused in the entire reception domain by the meta-stable state as in the above case. A 2FF synchronizer (FF: Flip Flop) in which two CLK2 having the same clock source is received by two stages is constructed as shown in FIG. 15B in order to eliminate the meta-stable state, whereby a stable logic value can be obtained. However, even in this arrangement, signal input timing is shifted by one cycle, resulting in a cycle-based random timing variation, i.e., CDC jitter.

In the case where the CDC jitter exits as described above, the following trouble may occur in a circuit configuration, as exemplified by FIG. 16, that receives a DATA signal at the output timing of a Valid signal. That is, although a transmission side has sent DATA=1 at the timing of Valid=1, a reception side falsely recognizes that DATA=0 has been sent due to the influence of the CDC jitter.

While whether a specification violation occurs in the output of DUT (Design Under Test (test target)) is checked in an RTL simulation, an additional special simulation method considering the CDC jitter is required in order to detect a failure caused by the CDC jitter when a verification is made for a circuit configuration of the DUT using simulation.

An example of a conventional CDC simulation method will be described with reference to FIGS. 17A and 17B. In the case of a circuit configuration in which a signal q2 is output based on two clock signals having different clock sources as shown in FIG. 17A, in order to achieve a circuit configuration considering the CDC jitter in this simulation, the circuit configuration of FIG. 17B is employed to execute the simulation.

That is, in the conventional CDC simulation, a selector that determines whether to output a signal s using a signal based on a jitter_R1 signal which is a random value (0 or 1) and an in_phase signal for checking a difference in the clock timing is built into an actual test circuit and then simulation is executed.

With reference to a flowchart of FIG. 18, the conventional simulation method will be further described below.

A conventional simulation apparatus executes a normal logic simulation (RTL simulation) for the DUT (S101). In the case where any error concerning the circuit arrangement has been detected (Yes in S102), a circuit modification is made (S109), and the flow returns to S101. On the other hand, in the case where no error has been detected (No in S102), it is determined whether a coverage criteria such as a line coverage is satisfied (S103). In the case where a coverage criteria is not satisfied (coverage is insufficient), (Yes in S103), an input pattern is added (S108), and the flow returns to S101.

In the case where a coverage criteria is satisfied (No in S103), the configuration shown in FIG. 17B is employed to execute the CDC simulation (S104). In the case where a result of the CDC simulation is error (Yes in S105), the circuit modification is made (S109). In the case where no error has been detected (No in S105), it is determined whether a coverage criteria is satisfied. In the case where a coverage criteria is satisfied (coverage is sufficient) (No in S106), the simulation is ended.

On the other hand, in the case where a coverage criteria is not satisfied (coverage is insufficient) (Yes in S106), a random number sequence in the CDC simulation is changed (S107), and the CDC simulation processing is executed once again (S104). There may be a case where a re-examination of the input pattern is required depending on circumstances (Yes in S106 to 3108).

As conventional technique relating to the present invention, the following documents have been disclosed.

[Patent Document 1]
Japanese Laid-open Patent Publication No. 2005-284426
[Patent Document 2]
Japanese Laid-open Patent Publication No. 2003-233638
[Patent Document 3]
Japanese Laid-open Patent Publication No. 2001-229211
[Non-Patent Document 1]
T. Ly, N. Hand, and C. K. Kwok, "Formally Verifying Clock Domain Crossing Jitter Using Assertion-Based Verification," in Proc. Design and Verification Conference and Exhibition, 2004.
[Non-Patent Document 2]
M. Litterick, "Pragmatic Simulation-Based Verification of Clock Domain Crossing Signals and Jitter Using SystemVerilog Assertions," in Proc. Design and Verification Conference and Exhibition, 2006.

In the CDC simulation, random influence such as a cycle-based timing variation or pulse disappearance/pulse generation in a reception register is exerted on the signal change propagation from a given clock domain to another clock domain. This is achieved by replacing the value of the reception register by a random value during a certain period of time during which it is determined (determination differs depending on a determination method) to be influenced by the CDC as described above.

However, many logical troubles appear in association with a change in a plurality of respective CDC signals or a plurality of changes in the same CDC signal.

For example, in a circuit shown in FIG. 19A, a signal change does not appear in an observation point F in an RTL simulation result (see the left side of FIG. 19B). However, in the case where the RTL+CDC model simulation considering the CDC jitter is executed, there may exist a pattern by which any signal change occurs in the observation point F depending on the input timing of clock signals S4, S5, and S6 in FIG. 19 (see the right side of FIG. 19B).

In order to detect presence/absence of a signal change in the observation point F in the conventional CDC simulation, it is preferably to execute CDC simulation processing in $2^n$ ways (in the example of FIG. 19, n=3(S4, S5, and S6), i.e., $2^3=8$ patterns) for one simulation pattern. That is, $2^n$ patterns are generated for the processing from step S106 to S107 and, accordingly, the CDC simulation processing (S104) needs to be executed in $2^n$ ways. Further, there may be a case where a signal change does not appear in the observation point in spite of execution of all the patterns. Therefore, execution of the CDC simulation may result in vain.

Along with a recent increase in complexity and stage number of a circuit, there arises a need to execute the CDC simulation an enormous number of times for one simulation pattern, causing an increase in verification cost and decrease in verification quality.

SUMMARY

According to an aspect of the present invention, there is provided a medium storing a logic simulation program, the program allowing a computer to execute: a step that acquires information concerning a predetermined observation point on a simulation target; a step that generates information concerning a jitter detection circuit for determining whether a time variation occurs in signal passing between a first circuit and a second circuit, the first circuit being arranged at the front stage on the simulation target relative to the predetermined observation point and configured to output a signal with a clock output from a predetermined clock source and the second circuit being arranged at the front stage on the simulation target relative to the predetermined observation point and at the rear stage relative to the first circuit and configured to output a signal with a clock output from a clock source different from the above predetermined clock source; and a step that generates information concerning a constraint circuit that is configured to create a signal to be output at the predetermined observation point using a logical expression of an output signal of the second circuit and output, based on the logical expression and output signal of the jitter detector circuit, a constraint signal constrained by the output signal of the jitter detector circuit and output signal of the second circuit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIGS. 2A and 2B are views showing an example of a concept of a CDC model according to the present embodiment;

FIG. 3 is a view showing a circuit configuration to be verified according to the present embodiment;

FIGS. 4A and 4B are views showing an example of data of the circuit configuration to be verified according to the present embodiment (FF list, combinational logic list);

FIGS. 5A and 5B are views showing an example of data of the circuit configuration to be verified according to the present embodiment (CDC list, observation point list);

FIGS. 7A and 7B are views showing an example in which 1-1 jitter detector according to the present embodiment is written as a module "JitterDetector( )";

FIG. 9 is a view showing an example in which the constraint solver according to the present embodiment is described as a module "ConstraintSolver( )";

FIGS. 19A and 19B are views showing an advantage of an RTL+CDC model simulation.

DESCRIPTION OF EMBODIMENT

This embodiment has been made to solve the above problems, and an object thereof is to provide a medium storing a logic simulation program, a logic simulation apparatus, and a logic simulation method that additionally includes a constraint condition imposed on a signal at target rear stage.

Figure 1:
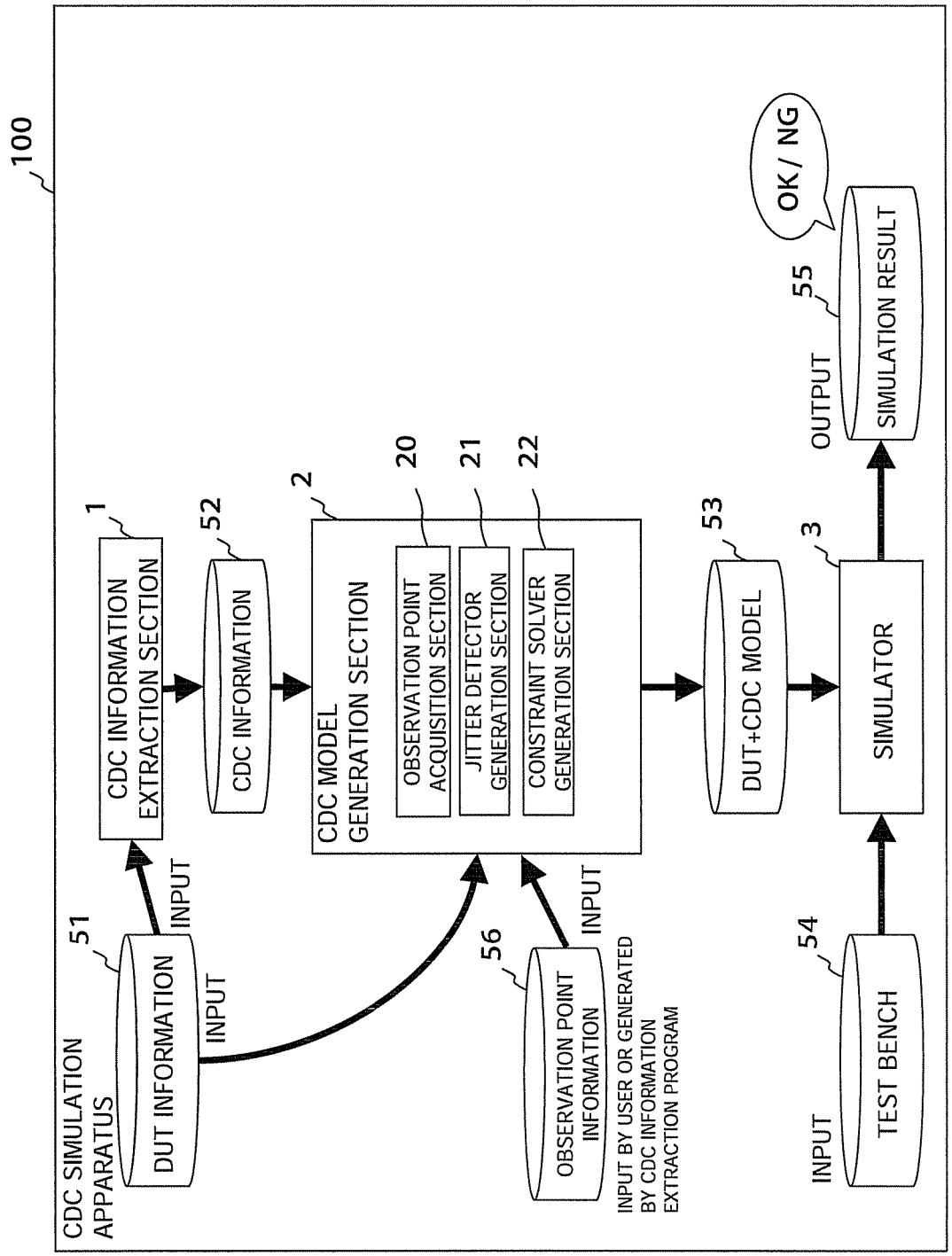
FIG. 1 is a view showing a functional configuration of a CDC simulation apparatus according to an embodiment of the present invention.

FIG. 1 illustrates a CDC simulation apparatus (logic simulation apparatus) according to an embodiment of the present invention. A CDC simulation apparatus 100 has a CDC information extraction section 1 that extracts CDC information 52 which is information concerning CDC from DUT information 51 which is information of a circuit to be verified. The CDC simulation apparatus 100 retains observation point information 56 which is information of a point on a simulation target (in the present embodiment, information concerning a physical circuit board to be subjected to simulation) for which presence/absence of a signal change is checked. The CDC simulation apparatus 100 has a CDC model generation section 2 that generates a CDC model (predetermined circuit information considering CDC jitter) based on the observation point information 56 and CDC information 52 and adds the generated CDC model to the DUT information 51 which is information of a circuit to be verified to thereby generate a DUT+CDC model 53. Although the observation point information 56 is assumed to be information input by a user or information acquired from an external system in the present embodiment, it may be generated by the CDC information extraction section 1.

The CDC simulation apparatus 100 has a simulator 3 that performs verification of a simulation target based on a test bench 54 which is virtual environment data and DUT+CDC model 53 and outputs a simulation result 55 which is a result (OK or NG) of the verification.

The DUT information 51, CDC information 52, observation point information 56, DUT+CDC model 53, test bench 54, and simulation result 55 are assumed to be retained in a database provided in the CDC simulation apparatus. The data structures of the DUT information 51, CDC information 52, test bench 54, and simulation result 55 are assumed to be the same as conventional ones. Further, configurations of the CDC information extraction section 1 and simulator 3 are also assumed to be the same as conventional ones.

The CDC model generation section 2 includes an observation point acquisition section 20, a jitter detector generation section 21 titter detection circuit generation section), and a constraint solver generation section 22 (constraint circuit generation section).

The observation point acquisition section 20 acquires the observation point information 56 from the database provided in the CDC simulation apparatus 100.

The jitter detector generation section 21 generates information concerning a jitter detector (jitter detection circuit) for determining whether a time variation occurs in signal passing between a first circuit and a second circuit. The first circuit is arranged at the front stage on a simulation target relative to an observation point specified by the observation point information 56 and is configured to output a signal with a clock output from a predetermined clock source. The second circuit is arranged at the front stage on the simulation target relative to the observation point and at the rear stage relative to the first circuit. The second circuit is configured to output a signal with a clock output from a clock source different from the above predetermined clock source.

The constraint solver generation section 22 generates information concerning a circuit (constraint circuit) that is constituted by a constraint solver and a selector circuit and is configured to create a signal to be output at the above observation point using a logical expression of an output signal of the second circuit and output, based on the logical expression and output signal of the jitter detector, a constraint signal constrained by the output signal of the jitter detector and output signal of the second circuit.

The jitter detector generation section 21 and constraint solver generation section 22 generate information concerning the jitter detector, constraint solver, and selector circuit in a range (hereinafter, referred to as "CDC portion" as needed) within which a time variation occurs in signal passing. In the present embodiment, the information concerning the jitter detector, constraint solver, and selector circuit is a simulation model including software descriptions written by Verilog hardware language (Verilog HDL). The concrete content of such information will be described later. The CDC simulation apparatus 100 executes simulation for information concerning a physical circuit board. Thus, it may be noted that a phrase "to generate a circuit" used in the present embodiment does not mean that hardware is generated physically but means "to generate a simulation model".

Next, a concept of the CDC model according to the present embodiment will be described with reference to FIGS. 2A and 2B. The CDC model generation section 2 generates a CDC model illustrated by FIG. 2B for a circuit having the CDC portion, which is illustrated by FIG. 2A. That is, in the CDC model, there are provided a jitter detector ("Jitter Detector" in the drawing) for determining whether the CDC jitter is inserted into a reception point, a constraint solver ("Constraint Solver" in the drawing) for selecting a reception point that exerts influence on the observation point F, and a selector. A signal satisfying the following conditions are transmitted by the constraint solver and selector.

$$f(S_1, S_2) != f(R_1, R_2)$$

$$S_1 = (J_1 ? V_1 : R_1)$$

$$S_2 = (J_2 ? V_2 : R_2)$$

$J_1$ and $J_2$ are each a signal value output from the jitter detector at a predetermined time, and $R_1$ and $R_2$ are each a signal value output from the reception point at a predetermined time. $R_1$, $R_2$, $J_1$, and $J_2$ are each a constant value obtained by the RTL simulation V1 and V2 are each a constrained random signal output from the constraint solver, the detail of which will be described later.

S=(J?V:R) means that a signal V is output as S when J is true (1), while a signal R is output as S when J is false (0). "!=" means "not equal".

In the present embodiment, a plurality of reception points having the same observation point at their rear stage are simultaneously considered. Further, in the present embodiment, circuit information from the transmission point to observation point is used in this manner.

Hereinafter, a concrete example of a configuration of a circuit to be verified will be described.

FIG. 3 illustrates a circuit configuration to be verified. The CDC portion for F which is a predetermined observation point is defined as a range denoted by a broken-line frame of FIG. 3. Thus, generation of the CDC model within the broken-line range will be described.

FIGS. 4A, 4B and 5A, 5B illustrate various data used in the present concrete example. Information concerning each FF (FF: Flip Flop) including an identifier (name) assigned for each FF, a clock input to the FF, and identifiers of signals input/output to/from the FF are retained as the DUT information 51 (see FIG. 4A). Further, information concerning a combinational logic circuit including an identifier (name) of a combinational circuit and a combinational definition are retained as the DUT information 51 (see FIG. 4B).

Further, information concerning the CDC including an identifier (name) of the CDC, a transmission-side FF (front-side FF), and a reception-side FF (rear-side FF) are retained as the CDC information 52 (see FIG. 5A). The CDC information 52 is information that the CDC information extraction section 1 extracts based on the FF list (FIG. 4A) in the DUT information 51. Further, information concerning the observation point including an identifier (name) of the observation point is retained as the observation point information 56 (see FIG. 5B).

Figure 6:
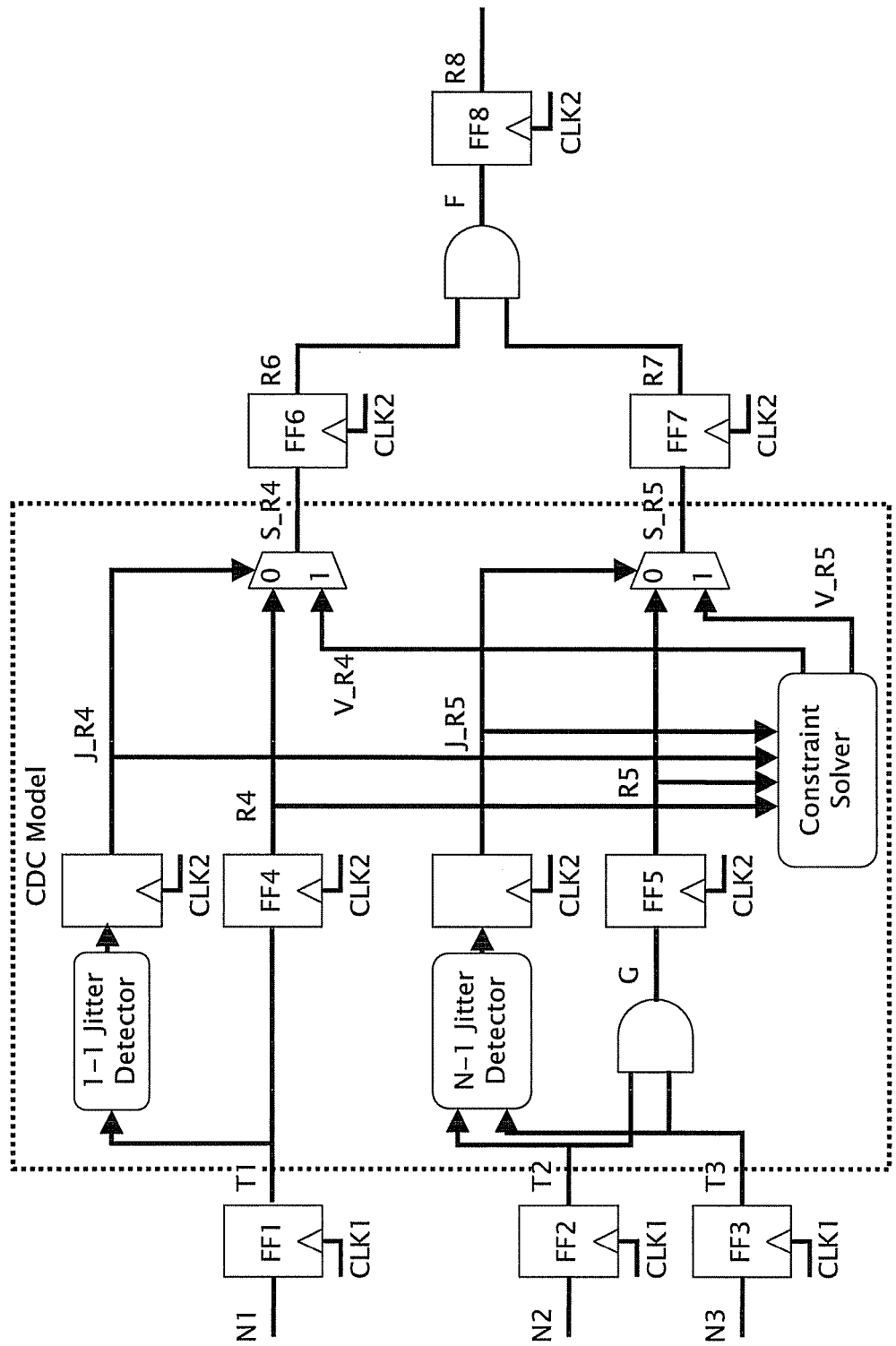
FIG. 6 is a view showing an example of a CDC model in which processing by a CDC model generation section is applied to a circuit configuration to be verified according to the present embodiment.

FIG. 6 illustrates a CDC model in which processing by the CDC model generation section 2 is applied to the circuit illustrated in FIG. 3. The jitter detector generation section 21 generates a 1-1 jitter detector as a jitter detector between FF1 and FF4 and an N-1 jitter detector as a jitter detector between FF2, FF3 and FF5. Further, the constraint solver generation section 22 generates a constraint solver that inputs J_R4 which is a signal output from the 1-1 jitter detector, R4 which is a signal output from FF4, J_R5 which is a signal output from the N-1 jitter detector, and R5 which is a signal output from FF5 and outputs random signals V_R4 and V_R5 in which a predetermined constraint has been added based on the abovementioned signals.

Further, the constraint solver generation section 22 generates a selector that outputs signal V_R4 as S_R4 when J_R4 is 1 and outputs R4 as S_R4 when J_R4 is 0 and generates a selector that outputs signal V_R5 as S_R5 when J_R5 is 1 and outputs R5 as S_R5 when J_R5 is 0.

The details of the 1-1 jitter detector, 1-N jitter detector, and constraint solver will be described below using the present concrete example.

First, the 1-1 jitter detector will be described. FIGS. 7A and 7B illustrate an example in which the 1-1 jitter detector is written as a module "JitterDetectoro" (information concerning jitter detector circuit) on Verilog hardware language (Verilog HDL). FIG. 7A illustrates an example of a 1-1 jitter detector that enables an output E (set the value of an output E to 1) for a certain time period (PERIOD=1) when the value of a signal T is changed. FIG. 7B illustrates an example of a 1-1 jitter detector that enables the output E (set the value of an output E to 1) until the clock's rising edge comes when the value of the signal T is changed. As can be seen from correspondence between respective variables and configuration illustrated in FIG. 6, relationships: T=T1, E=J_R4, RX_CLK=CLK2 are satisfied.

The jitter detector generation section 21 generates the JitterDetector( ) module by additionally writing to a previously prepared file written in Verilog HDL as the DUT information.

Figure 8:
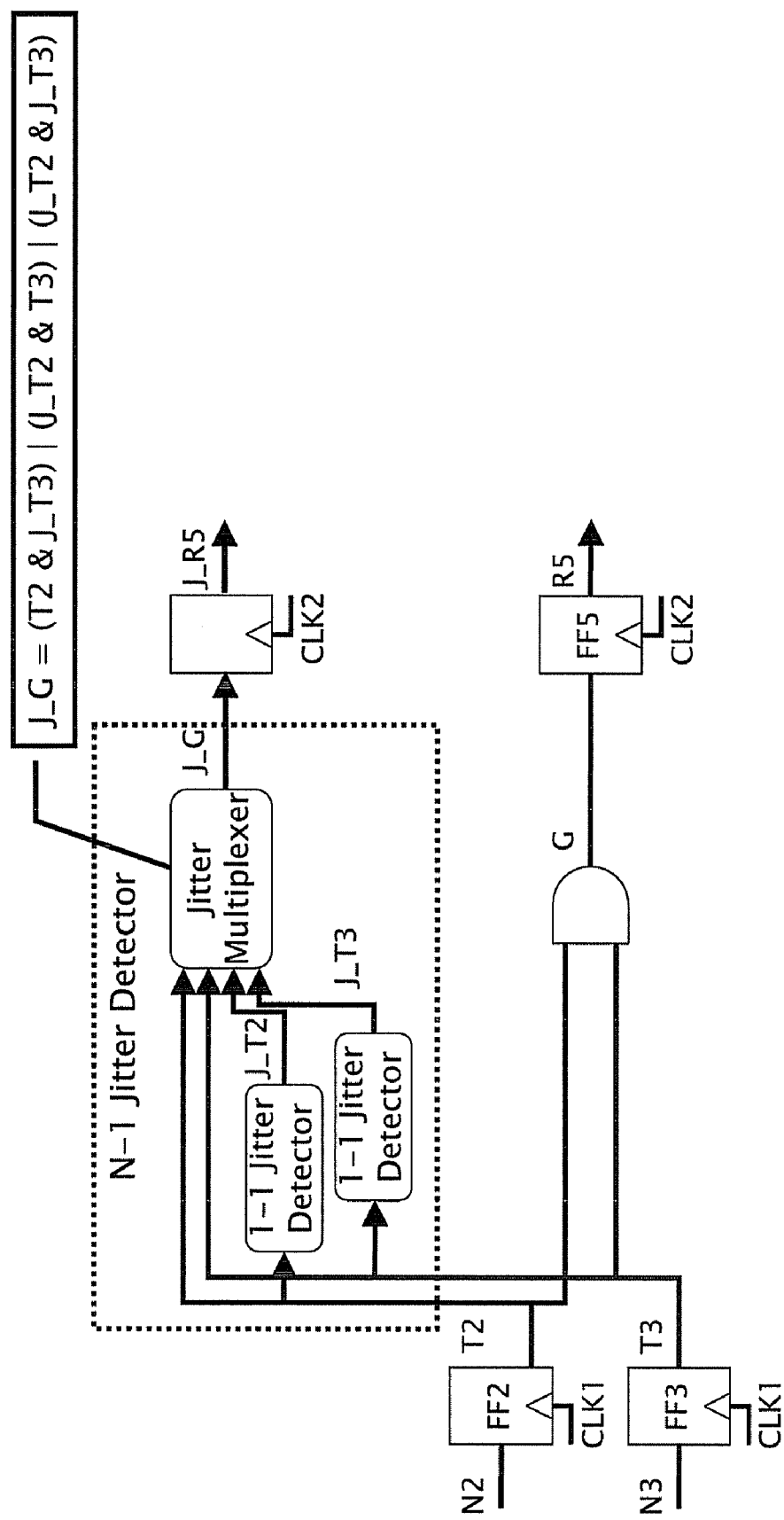
FIG. 8 is a view showing an internal configuration of an N-1 jitter according to the present embodiment.

Next, the N-1 jitter detector will be described. FIG. 8 illustrates an internal configuration of the N-1 jitterdetector. The N-1 jitter detector has a 1-1 jitter detector that receives T2 which is a signal from FF2 and outputs signal J_T2 and a 1-1 jitter detector that receives T3 which is a signal from FF3 and outputs signal J_T3. The configuration of the 1-1 jitter detector is the same as that of the 1-1 jitter detector that has been described above. The N-1 jitter detector has a jitter multiplexer (multiplexer circuit) that receives signals T2, J_T2, T3, and J_T3 and outputs J_G. The output condition of the jitter multiplexer is J_G=(T2&J_T3)|(J_T2&T3)|(J_T2&J_T3).

The output conditional expression of the jitter multiplexer generated in the jitter detector generation section 21 will be described by dividing a process of generating the conditional expression into two processes: a process of generating a general logical expression and process of generating a logical expression in which the general expression is applied to the present concrete example.

First, a general logical expression will be described. A general logical expression is generated in the following steps.

1. The jitter detector generation section 21 acquires from the DUT information 51 a logical expression g(T1, . . . , Tn) of a corresponding part.

2. The jitter detector generation section 21 substitutes a variable "Ti" appearing in the logical expression g(T1, . . . , Tn) with a logical expression
Ji?Vi:Ti (i=1, . . . , n, Ji is output of 1-1 jitter detector connected to Ti, Vi is a new variable) to obtain a new logical expression
g(J1?V1:T1, . . . , Jn?Vn:Tn).

3. The jitter detector 1, generation section 21 calculates a logical expression jg that realizes the jitter multiplexer.

$$jg(T1,\ldots,Tn,J1,\ldots,Jn)=(V1,\ldots,Vn).[g(J1?V1:T1,\ldots,Jn?Vn:Tn)!=g(T1,\ldots,Tn)]$$

where $$(E)\, y.[f(x1,\ldots,xm,y)]=f(x1,\ldots,xm,0)|f(x1,\ldots,xm,1)$$

$$(E)\, (y1,\ldots,yn).[f(x1,\ldots,xm,y1,\ldots,yn)]=(E)$$

(y1, . . . ,yn−1).[(E) yn.[f(x1, . . . ,xm,y1, . . . ,yn)]] is satisfied. Note that, in this embodiment, (E) means "existential quantifier".

4. The jitter detector generation section 21 outputs a Verilog HDL description of a combinational circuit that realizes the logical expression jg(T1, . . . ,Tn, J1, . . . ,Jn).

A process of generating a logical expression in which the above general logical expression is applied to the present concrete example is as follows.

1. The jitter detector generation section 21 acquires from the DUT information 51 a logical expression "T2&T3" of G. The logical expression of G is "T2&T3" since G is an AND circuit, while, in the case where G is, e.g., an OR circuit, the logical expression of G is "T2|T3".

2. The jitter detector generation section 21 substitutes a variable "T2" appearing in the logical expression "T2&T3" with a logical expression
J_T2?V_T2:T2
and substitutes a variable "T3" appearing in the logical expression "T2&T3" with a logical expression
J_T3?V_T3:T3
so as to obtain a new logical expression
(J_T2?V_T2:T2)&(J_T3?V_T3:T3).

3. The jitter detector generation section 21 calculates a logical expression that realizes the jitter multiplexer.

$$(E)(V\_T2,V\_T3).[((J\_T2?V\_T2:T2)\&(J\_T3?V\_T3:T3))!=(T2\&T3)]=(T2\&J\_T3)|(J\_T2\&T3)|(J\_T2\&J\_T3)$$

4. The jitter detector generation section 21 outputs a Verilog HDL description of a combinational circuit that realizes a logical expression
(T2&J_T3)|(J_T2&T3)|(J_T2&J_T3).

assign J_G=(T2&J_T3)|(J_T2&T3)|(J_T2&J_T3);

A process in which the constraint solver generation section 22 generates a constraint expression to be given to the constraint solver will be described by dividing a process of generating the constraint expression into two processes: a process of generating a general logical expression and process of generating a constraint expression in which the general expression is applied to the present concrete example.

First, a general logical expression will be described. A general logical expression is generated in the following processing steps.

1. The constraint solver generation section 22 acquires from the DUT information 51 a logical expression $f^o$ representing a value at a current observation point. It is assumed here that t=0 is satisfied.

2. When a logical expression $f^t$ includes a variable (output signal of the second circuit) representing the reception point (output of the reception FF (second circuit)), the constraint solver generation section 22 advances to processing step 4 described below.

3. The constraint solver generation section 22 substitutes respective variables (FF outputs) constituting the logical expression $f^t$ with logical expressions of the input sides of corresponding FFs so as to obtain a logical expression $f^{t+1}$ representing a value at the observation point after t+1 cycle. The constraint solver generation section 22 assigns t+1 to t, and the flow returns to processing step 2.

4. The constraint solver generation section 22 obtains the following constraint expression concerning outputs V1, . . . , Vn of the constraint solver.

$$f(J1?V1:Ri, \ldots, Jn?Vn:Rn)!=f(R1, \ldots, Rn)$$

When the generation method of the general expression is applied to the present concrete example, the following processing steps are executed.

1. The constraint solver generation section 22 acquires from the DUT information 51 a logical expression $f^0$=R6&R7 representing a current observation point.

2. 1. Since the logical expression $f^0$ does not include the variable (output signal of the second circuit) representing the reception point (output of the reception FF (second circuit)), the constraint solver generation section 22 executes processing step 3 described above.

3. 1. The constraint solver generation section 22 substitutes R6 and R7 constituting the logical expression $f^0$=R6&R7 with a logical expression R4 of the input side of FF6 and a logical expression R5 of the input side of FF7, respectively, to obtain a logical expression $f^1$=R4&R5 representing the observation point after one cycle. Then, the constraint solver generation section 22 executes processing step 2 described above.

4. The constraint solver generation section 22 obtains the following constraint expression concerning outputs V_R4 and V_R5 of the constraint solver.

$$((J\_R4?V\_R4:R4)\&(J\_R5?V\_R5:R5))!=(R4\&R5)$$

V_R4 and V_R5 satisfying the condition of the above expression are output by the constraint solver.

FIG. 9 illustrates an example in which the constraint solver is described as a module "ConstraintSolver( )" on Verilog HDL.

V_R4 and V_R5 which are variables having random values are declared in Solver class, and a constraint expression is also defined as ((J_R4?V_R4:R4)& (J_R5?V_R5:R5))!= (R4&R5) in Solver class.

An object s of Solver class is generated, and R4, R5, J_R4, and J_R5 which are input signal values, are assigned in the object s.

A random value 0 or 1 is assigned to V_R4 and V_R5 in the object s by randomized method of the object s, and the evaluation is made for the above constraint expression by if statement. When a result of the evaluation is true (1), 1 is assigned to variable "covered".

Figure 18:
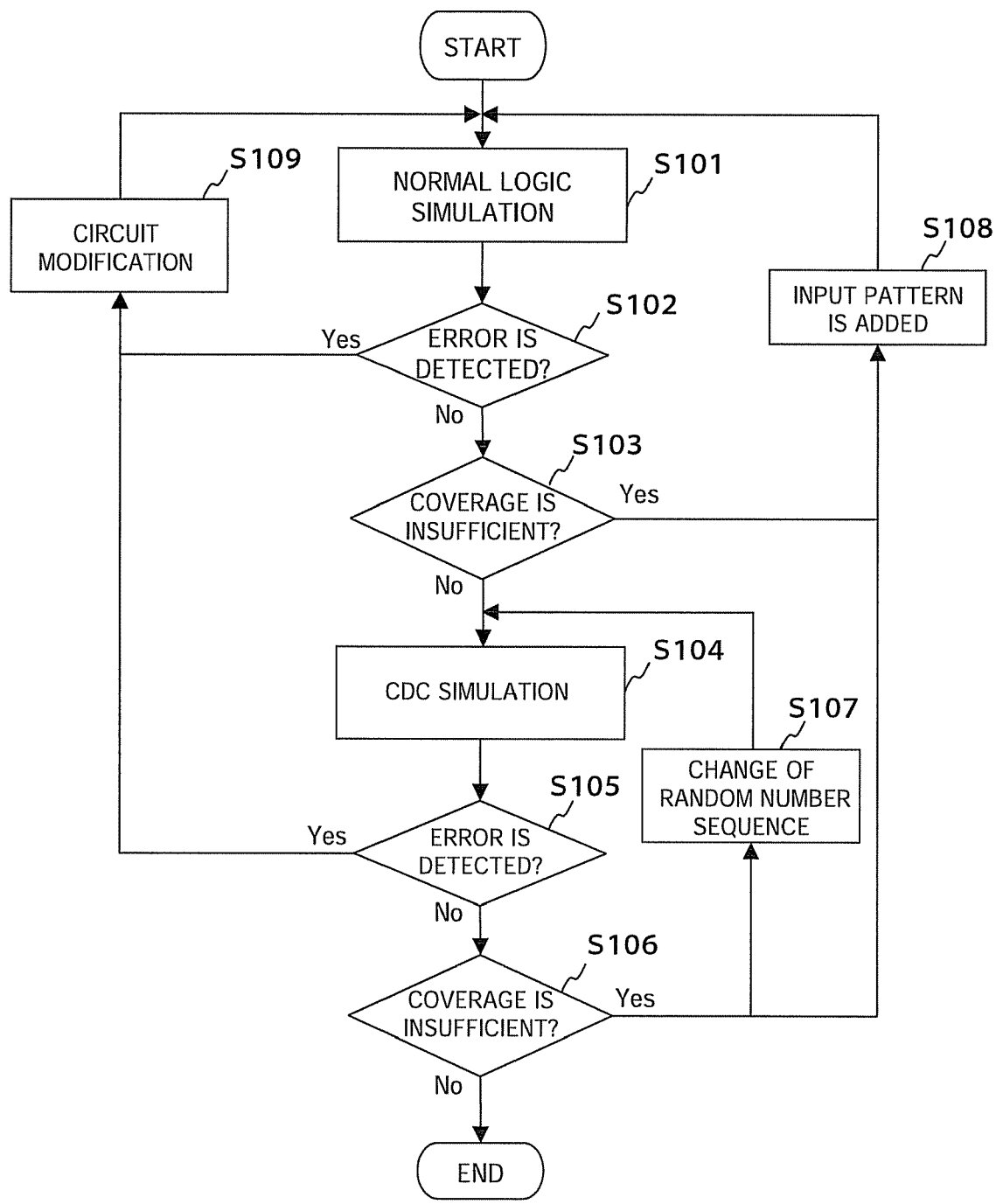
FIG. 18 is a flowchart showing an example of the conventional CDC simulation method.

After that, V_R4 and V_R5 satisfying the condition of the constraint expression are output to the outside of ConstraintSolver( ) as "output". When covered=1, it means that V_R4 and V_R5 satisfying the condition of the constraint expression have been found. By evaluating, in, e.g., S106 of FIG. 18, the value of the variable "covered" as a coverage criterion, it is possible to skip a processing step of changing the random number sequence, whereby a target signal can reliably be verified by a single simulation.

Figure 10:
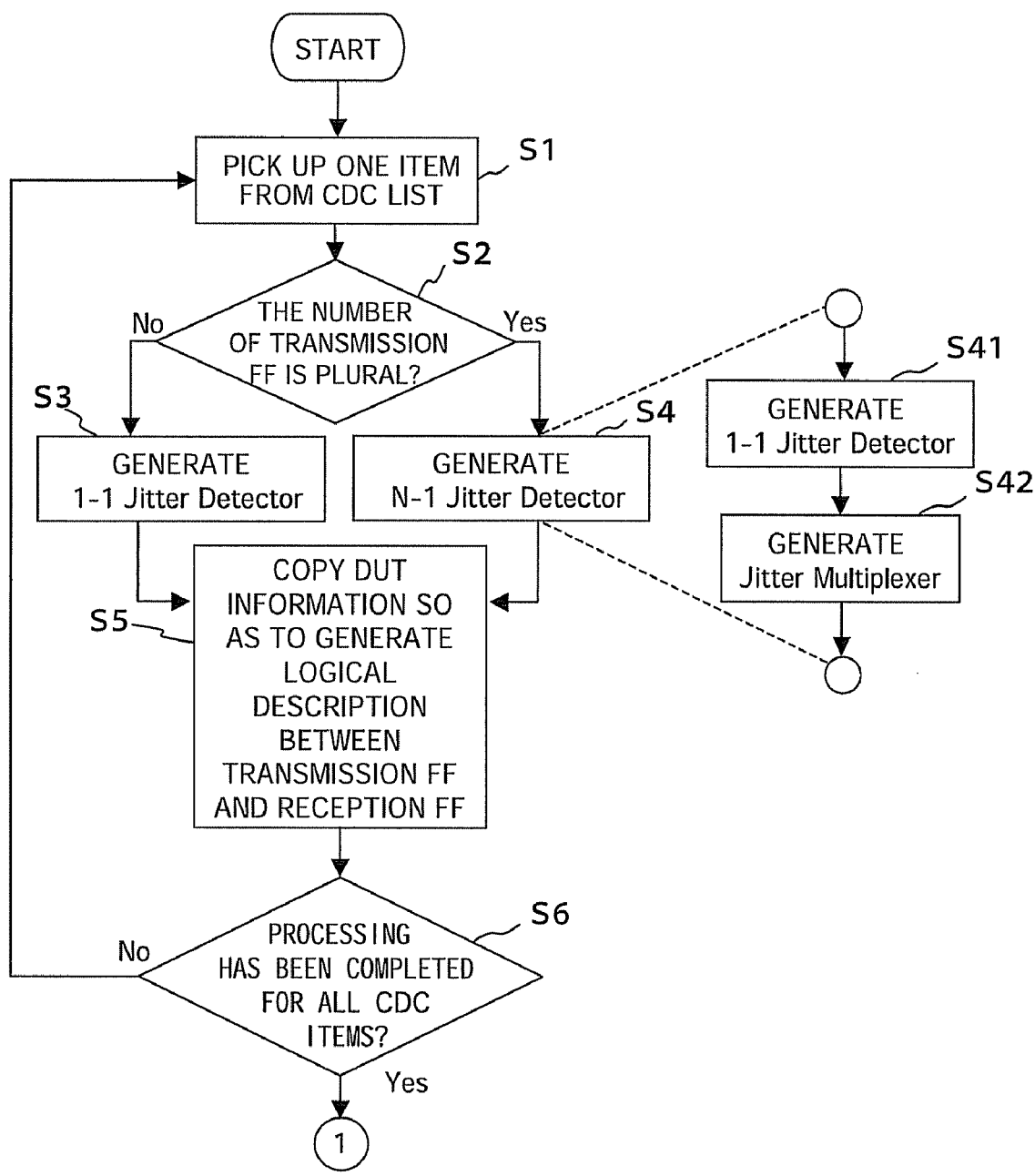
FIG. 10 is a (first) flowchart showing an example of operation of the CDC model generation section according to the present embodiment.
Figure 11:
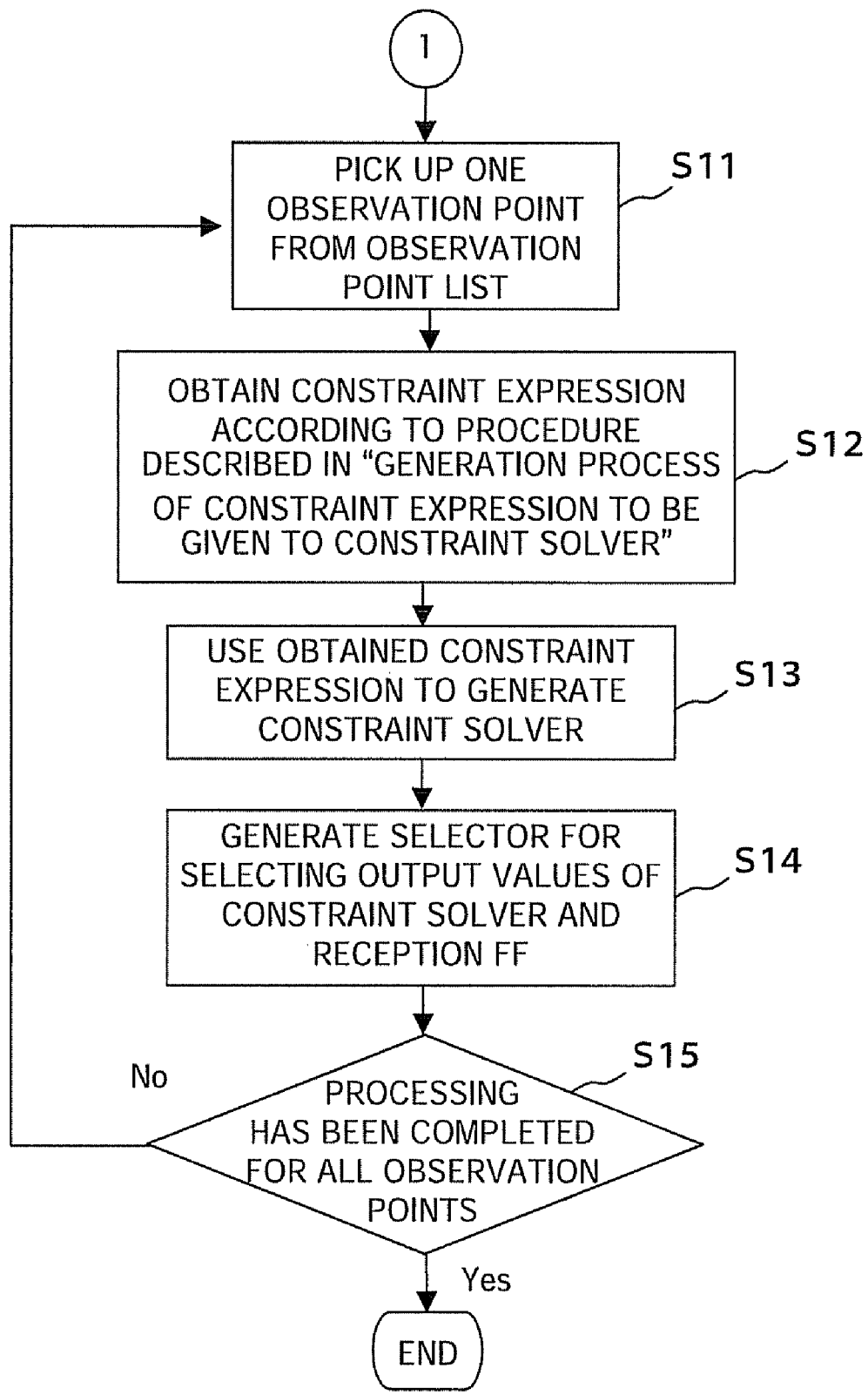
FIG. 11 is a (second) flowchart showing an example of operation of the CDC model generation section according to the present embodiment.

Operation of the present embodiment will be described with reference to flowcharts of FIGS. 10 and 11.

The jitter detector generation section 21 acquires one item from the CDC list (S1). The jitter detector generation section 21 determines whether the number of the transmission FFs (first circuit) is plural (S2). When the number of the transmission FFs is plural (Yes in S2), the jitter detector generation section 21 generates the N-1 jitter detector in Verilog HDL (S4). The N-1 jitter detector is achieved as a result of generation of the 1-1 jitter detector (S41) and generation of the jitter multiplexer (S42).

On the other hand, when the number of the transmission FFs is singular (No in S2), the jitter detector generation section 21 generates the 1-1 jitter detector in Verilog HDL (S3).

Thereafter, the jitter detector generation section 21 copies the DUT information 51 so as to generate a logical description between the transmission FF and reception FF (second circuit) (S5). The jitter detector generation section 21 determines whether the above processing has been completed for all CDC items (S6). When there is any CDC item for which the processing has not been performed (No in S6), the flow returns to S1. When the processing has been completed for all CDC items (Yes in S6), the flow advances to the next step (to S11 of FIG. 11).

The constraint solver generation section 22 acquires one observation point from the observation point list (S11) and obtains a constraint expression according to a procedure described in the above "generation process of constraint expression to be given to constraint solver" (S12). The constraint solver generation section 22 uses the obtained constraint expression to generate the constraint solver in Verilog HDL (S13)

Thereafter, the constraint solver generation section 22 generates a selector for selecting the output values of the constraint solver and reception FF in Verilog HDL.

Finally, it is determined whether the above processing has been completed for all observation points. When there is any observation point for which the processing has not been performed (No in S15), the flow returns to S11. When the processing has been completed for all observation points (Yes in S15), the flow is ended.

Figure 12:
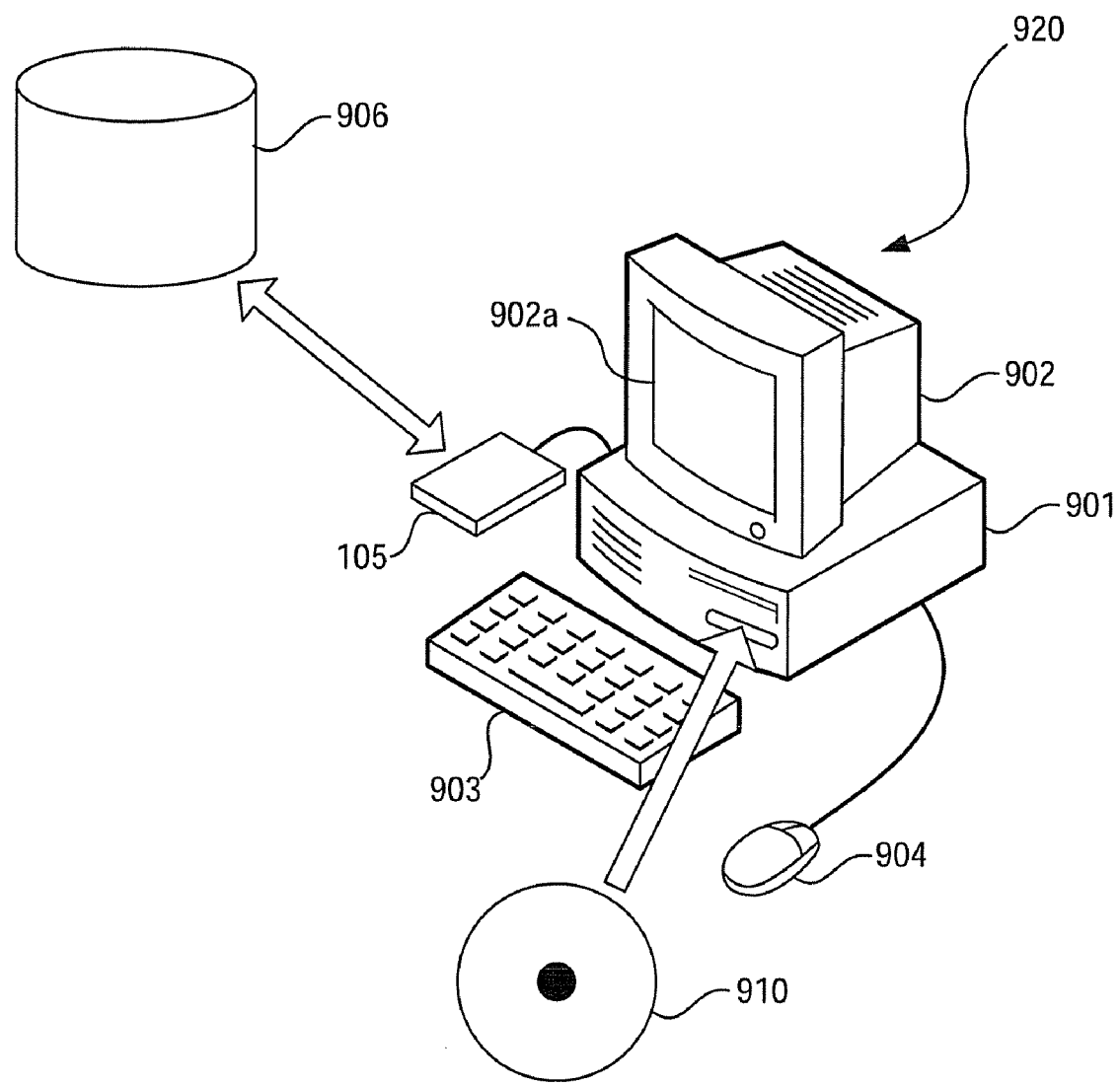
FIG. 12 is a view showing an example of a computer system applied to the present embodiment.

The present invention can be applied to a computer system as described below. FIG. 12 is a view illustrating an example of a computer system to which the present invention is applied. A computer system 920 illustrated in FIG. 12 includes a main body portion 901 incorporating a CPU, a disk drive, and the like, a display 902 that displays an image according to an instruction from the main body portion 901, a keyboard 903 used for inputting various information to the computer system 920, a mouse 904 used for designating a given position on a display screen 902a of the display 902, and a communication unit 905 that accesses an external database and the like to download a program and the like stored in another computer system. Examples of the communication unit 905 may include a network communication card, modem, and the like.

It is possible to provide a program that allows the above computer system constituting the logic simulation apparatus to execute the above steps as a logic simulation program. By storing the above program in a computer-readable storage medium, it is possible to allow the computer system constituting the logic simulation apparatus to execute the program. The program executing the above steps is stored in a portable storage medium such as a disk 910 or downloaded from a recording medium 906 of another computer system 905. Further a logic simulation program (logic simulation software) for allowing the computer system 920 to have at least a logic simulation function is input to the computer system 920 and is then complied. The logic simulation program allows the computer system 920 to operate as a logic simulation apparatus having a logic simulation function. Further, the logic simulation program may be stored in a computer-readable recording medium such as a disk 910. The medium that can be read by the computer system 920 includes: an internal storage device mounted in a computer, such as ROM or RAM, a portable storage medium such as a disk 110, a flexible disk, a DVD disk, a magneto-optical disk, or an IC card; a database holding a computer program; another computer system and database thereof; and various recording medium connected to the computer system through a communication means such as the communication unit 105 to be accessed by the computer system.

Figure 13:
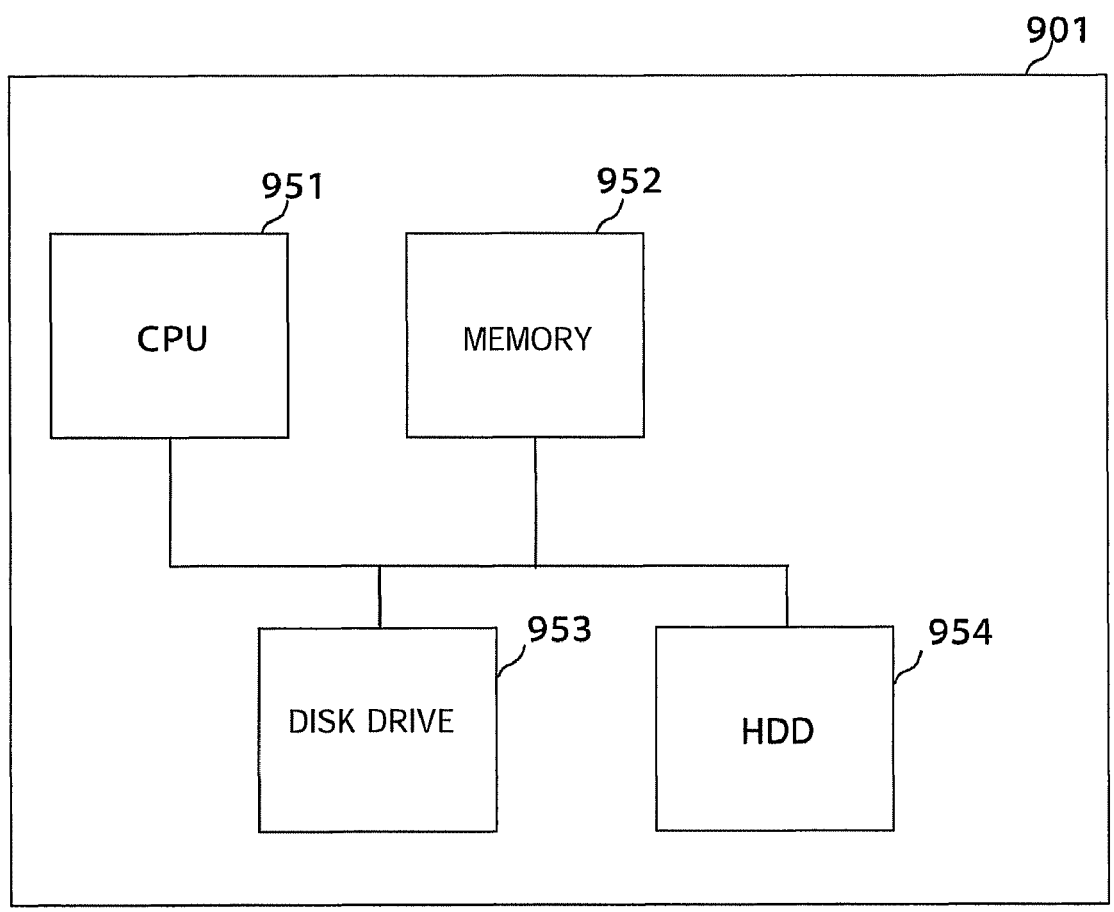
FIG. 13 is a view showing an example of a hardware configuration of a main body portion in the computer system applied to the present embodiment.
Figure 14A:
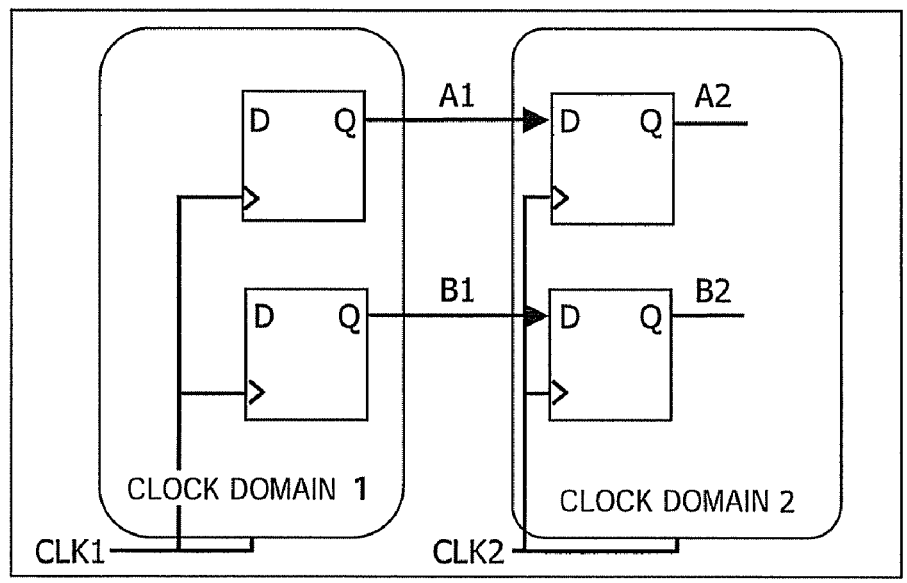
FIGS. 14A and 14B are views showing an arrangement example of clock domains.
Figure 14B:
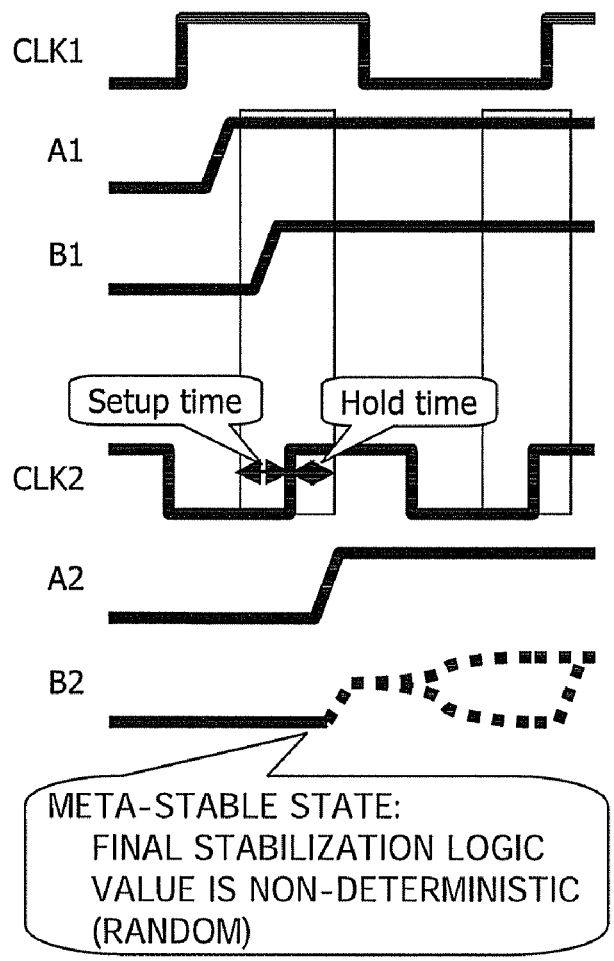
Figure 15A:
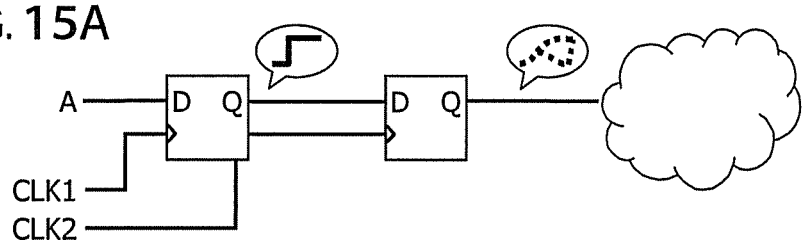
FIGS. 15A and 15B are views showing another arrangement example of clock domains different from FIG. 14.
Figure 15B:
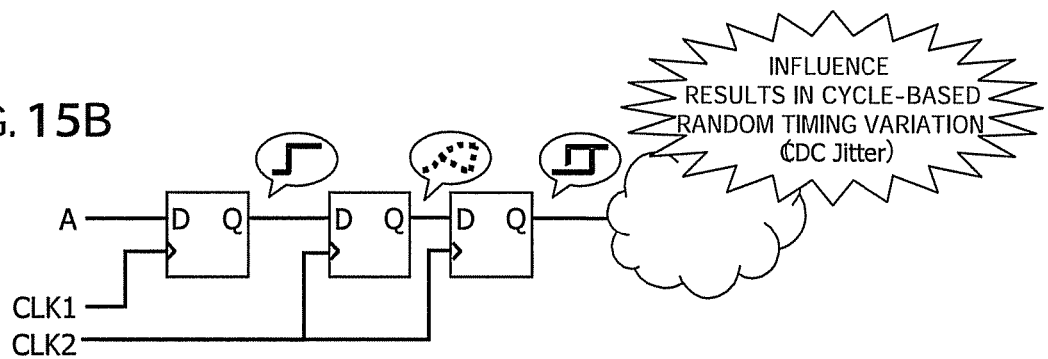
Figure 16:
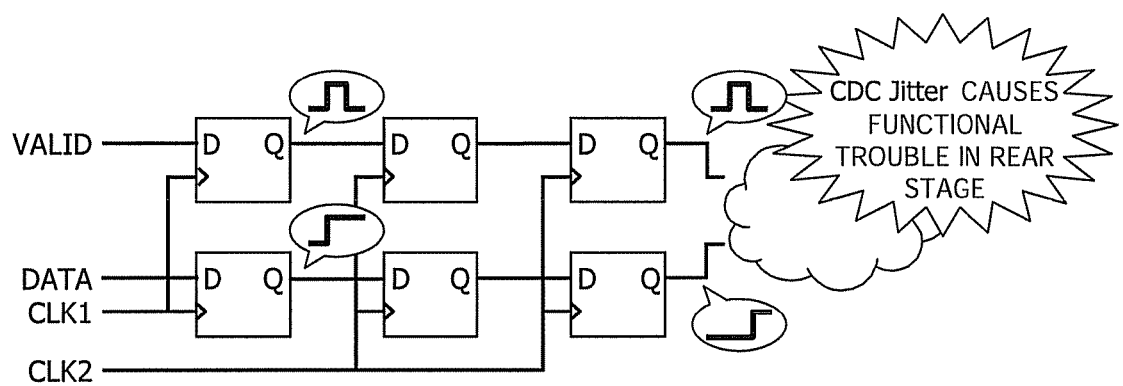
FIG. 16 is a view for explaining a trouble caused due to a difference, which occurs in a predetermined circuit, between the output timings of Valid signal and DATA signal.
Figure 17A:
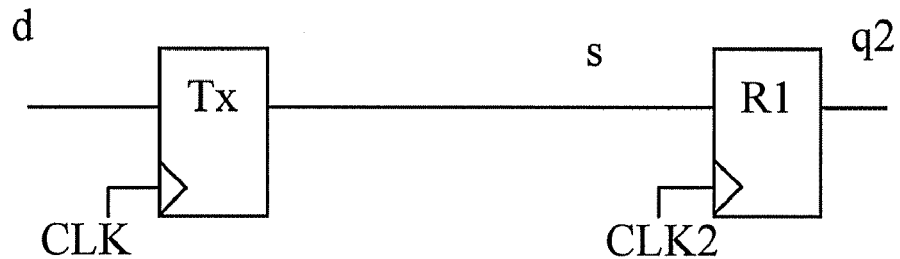
FIGS. 17A and 17B are views for explaining an example of a conventional CDC simulation method.
Figure 17B:
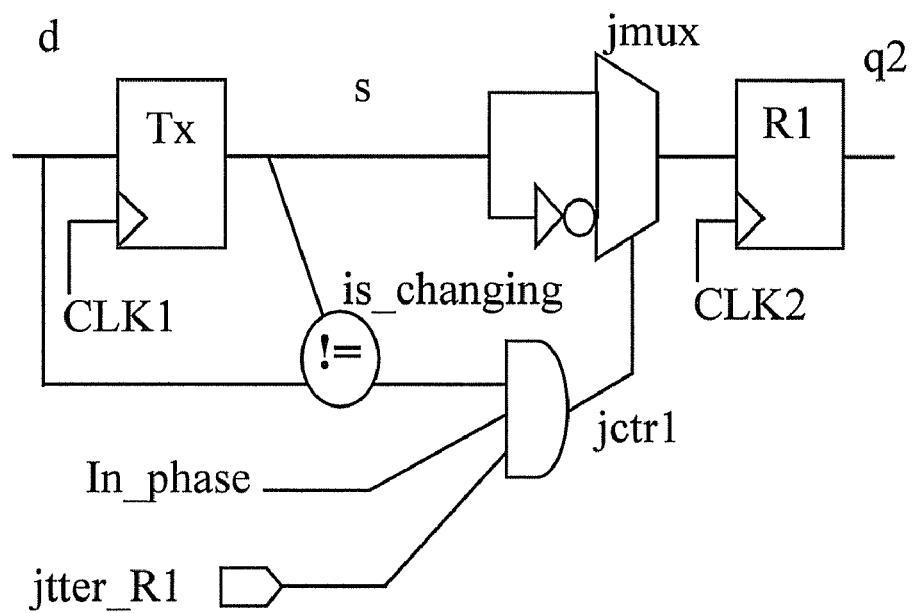

FIG. 13 is a view illustrating an example of a hardware configuration of the main body portion 901 in the computer system 920. The main body portion 901 includes a CPU (Central Processing Unit) 951, a memory 952, a disk drive 953 that reads/writes data from/to a portable recording medium such as the disk 910, and an HDD (Hard Disk Drive) 954 which is a non-volatile storage means. The above components are realized by a program that has been previously stored in a non-volatile storage means such as the HDD 954 or disk 910 cooperating with hardware resources such as the CPU 951 and memory 952.

By adding a constraint condition representing the influence on a target observation point, it is possible to consider the influence on rear stages of the second circuit as a criterion of selection of a random number, which has not been taken into consideration in a conventional technique. As a result, a target signal can reliably be verified by a single simulation.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A computer-readable recording medium storing a logic simulation program, the program allowing a computer to execute:
a step that acquires information concerning a predetermined observation point on a simulation target;
a step that generates information concerning a jitter detection circuit for determining whether a time variation occurs in a signal passing between a first circuit and a second circuit, the first circuit being arranged at the front stage on the simulation target relative to the predetermined observation point and configured to output a signal with a clock output from a predetermined clock source and the second circuit being arranged at the front stage on the simulation target relative to the predetermined observation point and at the rear stage relative to the first circuit and configured to output a signal with a clock output from a clock source different from the above predetermined clock source; and
a step that generates information concerning a constraint circuit that is configured to create a signal to be output at the predetermined observation point using a logical expression of an output signal of the second circuit and output, based on the logical expression and output signal of the jitter detector circuit, a constraint signal constrained by the output signal of the jitter detector circuit and the output signal of the second circuit.

2. The computer-readable recording medium storing a logic simulation program according to claim 1, wherein
the step that generates information concerning the jitter detection circuit and step that generates information concerning the constraint circuit in the logic simulation program further generate information concerning the jitter detector circuit and constraint circuit in a range within which a time variation occurs in signal passing.

3. The computer-readable recording medium storing a logic simulation program according to claim 1, wherein
in the case where the number of the first circuits is plural and the number of the second circuits is singular, the step that generates information concerning the jitter detection circuit in the logic simulation program further generates, at one stage after each of jitter detector circuits generated based on the first circuits, information concerning a multiplexer circuit that outputs, to the second circuit, a signal based on the output signals from the jitter detector circuits and output signals from the first circuits.

4. The computer-readable recording medium storing a logic simulation program according to claim 1, wherein
the step that generates information concerning the constraint circuit in the logic simulation program generates information concerning a constraint circuit that outputs a signal satisfying:

$$(J?V:R)!=(R)$$

where V is a constraint signal, R is an output signal from the second circuit, and J is an output signal from the jitter detection circuit.

5. A computer system constituting a logic simulation apparatus to execute a logic simulation program, comprising:
an observation point acquisition section that acquires information concerning a predetermined observation point on a simulation target;
a jitter detection circuit generation section that generates information concerning a jitter detection circuit for determining whether a time variation occurs in a signal passing between a first circuit and a second circuit, the first circuit being arranged at the front stage on the simulation target relative to the predetermined observation point and configured to output a signal with a clock output from a predetermined clock source and the second circuit being arranged at the front stage on the simulation target relative to the predetermined observation point and at the rear stage relative to the first circuit and configured to output a signal with a clock output from a clock source different from the above predetermined clock source; and
a constraint circuit generation section that generates information concerning a constraint circuit that is configured to create a signal to be output at the predetermined observation point using a logical expression of an output signal of the second circuit and output, based on the logical expression and output signal of the jitter detector circuit, a constraint signal constrained by the output signal of the jitter detector circuit and the output signal of the second circuit.

6. The logic simulation apparatus according to claim 5, wherein
the jitter detection circuit generation section and constraint circuit generation section generate information concerning the jitter detector circuit and constraint circuit in a range within which a time variation occurs in signal passing.

7. The logic simulation apparatus according to claim 5, wherein
in the case where the number of the first circuits is plural and the number of the second circuits is singular, the jitter detection circuit generation section generates, at one stage after each of jitter detector circuits generated based on the first circuits, information concerning a multiplexer circuit that outputs, to the second circuit, a signal based on the output signals from the jitter detector circuits and output signals from the first circuits.

8. The logic simulation apparatus according to claim 5, wherein
the constraint circuit generation section generates information concerning a constraint circuit that outputs a signal satisfying:

(J?V:R)!=(R)

where V is a constraint signal, R is an output signal from the second circuit, and J is an output signal from the jitter detection circuit.

9. A logic simulation method in which a computer executes:
a step that acquires information concerning a predetermined observation point on a simulation target;
a step that generates information concerning a jitter detection circuit for determining whether a time variation occurs in a signal passing between a first circuit and a second circuit, the first circuit being arranged at the front stage on the simulation target relative to the predetermined observation point and configured to output a signal with a clock output from a predetermined clock source and the second circuit being arranged at the front stage on the simulation target relative to the predetermined observation point and at the rear stage relative to the first circuit and configured to output a signal with a clock output from a clock source different from the above predetermined clock source; and
a step that generates information concerning a constraint circuit that is configured to create a signal to be output at the predetermined observation point using a logical expression of an output signal of the second circuit and output, based on the logical expression and output signal of the jitter detector circuit, a constraint signal constrained by the output signal of the jitter detector circuit and the output signal of the second circuit.

10. The logic simulation method according to claim 9, wherein
the step that generates information concerning the jitter detection circuit and step that generates information concerning the constraint circuit further generate information concerning the jitter detector circuit and constraint circuit in a range within which a time variation occurs in signal passing.

11. The logic simulation method according to claim 9, wherein
in the case where the number of the first circuits is plural and the number of the second circuits is singular, the step that generates information concerning the jitter detection circuit further generates, at one stage after each of jitter detector circuits generated based on the first circuits, information concerning a multiplexer circuit that outputs, to the second circuit, a signal based on the output signals from the jitter detector circuits and output signals from the first circuits.

12. The logic simulation method according to claim 9, wherein
the step that generates information concerning the constraint circuit generates information concerning a constraint circuit that outputs a signal satisfying:

(J?V:R)!=(R)

where V is a constraint signal, R is an output signal from the second circuit, and J is an output signal from the jitter detection circuit.

* * * * *